US007309833B2

(12) United States Patent
Robeson et al.

(10) Patent No.: US 7,309,833 B2
(45) Date of Patent: Dec. 18, 2007

(54) PHOTOVOLTAIC DEVICES COMPRISING LAYER(S) OF PHOTOACTIVE ORGANICS DISSOLVED IN HIGH TG POLYMERS

(75) Inventors: Lloyd Mahlon Robeson, Macungie, PA (US); Xuezhong Jiang, Breinigsville, PA (US); William Franklin Burgoyne, Jr., Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 655 days.

(21) Appl. No.: 10/630,279

(22) Filed: Jul. 29, 2003

(65) Prior Publication Data

US 2005/0022865 A1    Feb. 3, 2005

(51) Int. Cl.
*H01L 31/0256* (2006.01)

(52) U.S. Cl. .................................. 136/263; 136/252

(58) Field of Classification Search ................ 136/263
See application file for complete search history.

(56) References Cited

U.S. PATENT DOCUMENTS

| | | | |
|---|---|---|---|
| 4,125,414 A | 11/1978 | Tang et al. | 136/89 NB |
| 4,175,981 A | 11/1979 | Loutfy et al. | 136/89 SJ |
| 5,536,588 A * | 7/1996 | Naito | 428/690 |
| 5,658,994 A | 8/1997 | Burgoyne, Jr. et al. | |
| 5,874,516 A | 2/1999 | Burgoyne, Jr. et al. | |
| 6,060,170 A * | 5/2000 | Burgoyne, Jr. | 428/457 |
| 6,084,176 A * | 7/2000 | Shiratsuchi et al. | 136/263 |
| 6,818,919 B2 * | 11/2004 | Robeson et al. | 257/40 |

OTHER PUBLICATIONS

Minami, et al., J. Appl. Phys., 54(11), 6764-6766, Nov. 1983.
Yu and Heeger, J. Appl. Phys., 78(7), 4510-4515, Oct. 1, 1995.
Shaheen, Synthetic Metals, 121, 1583-1584 (2001).
Dittmer, Janke J. et al; Electron Trapping in Dye/Polymer Blend Photovoltaic Cells; Adv. Mater. 2000, 12, No. 27; pp. 1270-1274.
Robeson, L.M. et al; "Dynamic Mechanical Characteristics of Polysulfone and Other Polyarylethers;" Midland Macromolecular Institute; pp. 405-424, year not available.

* cited by examiner

*Primary Examiner*—Nam Nguyen
*Assistant Examiner*—Anthony Fick
(74) *Attorney, Agent, or Firm*—Michael K. Boyer

(57) ABSTRACT

A photovoltaic device having an anode, a cathode, and at least one photoactive layer between the anode and the cathode, wherein the at least one photoactive layer includes a composition containing a polymer having a glass transition temperature of at least 125° C.; and a photoactive material, wherein: (a) the photoactive material is a hole transporting organic material, an electron transporting organic material, and/or a light harvesting organic material, (b) the polymer and the photoactive material are in a single phase (c) the photoactive material constitutes at least 20% by weight of the composition, and (d) the at least one photoactive layer is in electrical communication with the anode and the cathode, the anode and the cathode are configured to conduct an electric charge from the at least one photoactive layer produced by the at least one photoactive layer absorbing light.

22 Claims, 12 Drawing Sheets

PHOTOVOLTAIC DEVICES COMPRISING LAYER(S) OF PHOTOACTIVE ORGANICS DISSOLVED IN HIGH TG POLYMERS

BACKGROUND OF THE INVENTION

This invention relates to photovoltaic devices useful for converting light into electrical energy, and more specifically to devices for converting solar energy into electrical energy.

The conversion of solar energy into electrical energy is one of the prime technologies which can have a major impact on the future energy requirements of the world as well as solving the impending global warming problems due to present increasing usage of carbon based energy sources. Development of efficient and low cost photovoltaic devices is key to significant utility of direct solar energy to electrical power conversion. The utility of inorganic semiconductor materials in photovoltaic cells to convert incident light energy into electrical energy is well known and constitutes a major article of commerce. Crystalline silicon is among the best-known inorganic semiconductors for photovoltaic devices and is widely employed. Other inorganics commonly noted for utility in photovoltaic devices include gallium arsenide, amorphous silicon and cadmium sulfide. For these semiconductors, the electronic structure is comprised of a valence band and a conduction band separated by an energy gap (band gap). An incident photon can excite the electron from the valence band into the conduction band of the semiconductor if the photon energy is higher than the band gap. The most common form of semiconductor junctions in photovoltaic cells is the p-n junction. An incident photon can excite the electron from the valence band into the conduction band of the semiconductor leaving mobile holes in the valence band and thereby generating electron-hole pairs. The electric field at the junction prevents the recombination, the holes move from the n position to the p position and electrons move in the opposite direction. If the junction is connected to electrodes, a current can be produced. Certain conjugated polymers and electroactive organic materials can also exhibit semiconductor-like properties and can also be employed in similar photovoltaic devices to convert solar energy to electrical energy.

Organic based photovoltaic devices offer specific fabrication and economic advantages over inorganic materials for photovoltaic applications if reasonable efficiencies can be achieved. These devices involve thin films of the active organic materials between metal electrodes of which at least one electrode is transparent to incident (e.g., sun) light. These organics (often referred to as light harvesting organics) include perylene, oligomeric thiophenes, phthalocyanines, triphenyl methane based compound, π-conjugated polymers, pyrromethene dyes, etc.

Phthalocyanine particles dispersed in a polymeric binder have been employed in photovoltaic devices. Minami et al. (J. Appl. Phys., 54(11), 6764-6766, November 1983) discloses the use of metal-free phthalocyanines dispersed in various polymers (ten different polymers are noted, including poly(vinyl acetate), polystyrene, polyacrylonitrile, poly (vinyl fluoride), poly(vinylidene chloride), and poly(vinylidene fluoride). These polymers were generally not high $T_g$ or even exclusively amorphous. As the polymer is employed as a binder for particles, the polymer $T_g$ is not specifically important. Film thicknesses employed were between 1 and 3 microns.

U.S. Pat. No. 4,175,981 to Loutfy et al. discloses the use of metal-free phthalocyanines dispersed in a polymeric binder (such as poly(vinyl acetate), Bisphenol A polycarbonate, polystyrene and styrene copolymers). The addition of a dye sensitizer (such as Coumarin dyes) is disclosed.

Brabec et al. (J. Appl. Phys., 85(9), 6866-6872, May 1999) disclose photovoltaic properties of a soluble derivative of poly (p-phenylene vinylene) and methanofullerene (donor-acceptor complex) embedded in a polystyrene matrix. The mixture was described as an interpenetrating polymer network.

U.S. Pat. No. 4,125,414 to Tang et al. describes a photovoltaic element comprised of a layer of an electrically insulating binder, a pyrylium-type dye salt and an organic photoconductor. Various polycarbonates were noted as the electrically insulating binder. Organic photoconductors employed included tritolylamine. These compositions are described as aggregate photoconductive materials, wherein a discrete discontinuous phase composed of a particulate co-crystalline phase of the binder and dye is dispersed in a continuous phase of the binder and photoconductor.

Yu and Heeger (J. Appl. Phys., 78(7), 4510-4515, 1 Oct. 1995) describe a phase separated polymer (poly(2-methoxy-5-(2'-ethyl-hexyloxy)-1,4-phenylene vinylene as a donor and cyano modified poly(phenylene vinylene) as an acceptor) for utility in photodetector and photovoltaic applications.

Shaheen (Synthetic Metals, 121, 1583-1584 (2001)) discusses low band-gap polymeric photovoltaic devices comprising thiophene-isothianapthene copolymers doped with soluble fullerene derivatives blended into PMMA to enhance film quality. The thiophene-isothianapthene copolymers had a molecular weight of 6000-8000 amu. The phase behavior of the copolymer and PMMA is not disclosed.

Despite the foregoing developments, it is desired to obtain compositions with improved characteristics for use in photovoltaic devices All references cited herein are incorporated herein by reference in their entireties.

BRIEF SUMMARY OF THE INVENTION

Accordingly, the invention provides a photovoltaic device comprising: an anode; a cathode; and at least one photoactive layer between the anode and the cathode, wherein the at least one photoactive layer comprises a composition comprising a polymer having a glass transition temperature of at least 125° C.; and a photoactive material, wherein: (a) the photoactive material is at least one member selected from the group consisting of a hole transporting organic material, an electron transporting organic material, and a light harvesting organic material, (b) the polymer and the photoactive material are in a single phase, (c) the photoactive material constitutes at least 20% by weight of the composition, and (d) the at least one photoactive layer is in electrical communication with the anode and the cathode, wherein the anode and the cathode are configured to conduct an electric charge from the at least one photoactive layer produced by the at least one photoactive layer absorbing light.

Further provided is a method of manufacturing the photovoltaic device of the invention, said method comprising: providing an anode; providing a cathode; and providing at least one photoactive layer between the anode and the cathode, wherein the at least one photoactive layer is in electrical communication with the anode and the cathode and wherein the anode and the cathode are configured to conduct an electric charge from the at least one photoactive layer produced by the at least one photoactive layer absorbing light.

Also provided is a method of manufacturing the photovoltaic device of the invention, wherein the at least one photoactive layer is manufactured by a fabrication technique selected from the group consisting of spin coating, screen printing, ink jet printing and roll-to-roll printing.

Also provided is a method of manufacturing the photovoltaic device of the invention, wherein the anode is provided on a first side of the at least one photoactive layer, the cathode is provided on a second side of the at least one photoactive layer, and a transparent substrate is provided on a side of the anode facing away from the at least one photoactive layer.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1:
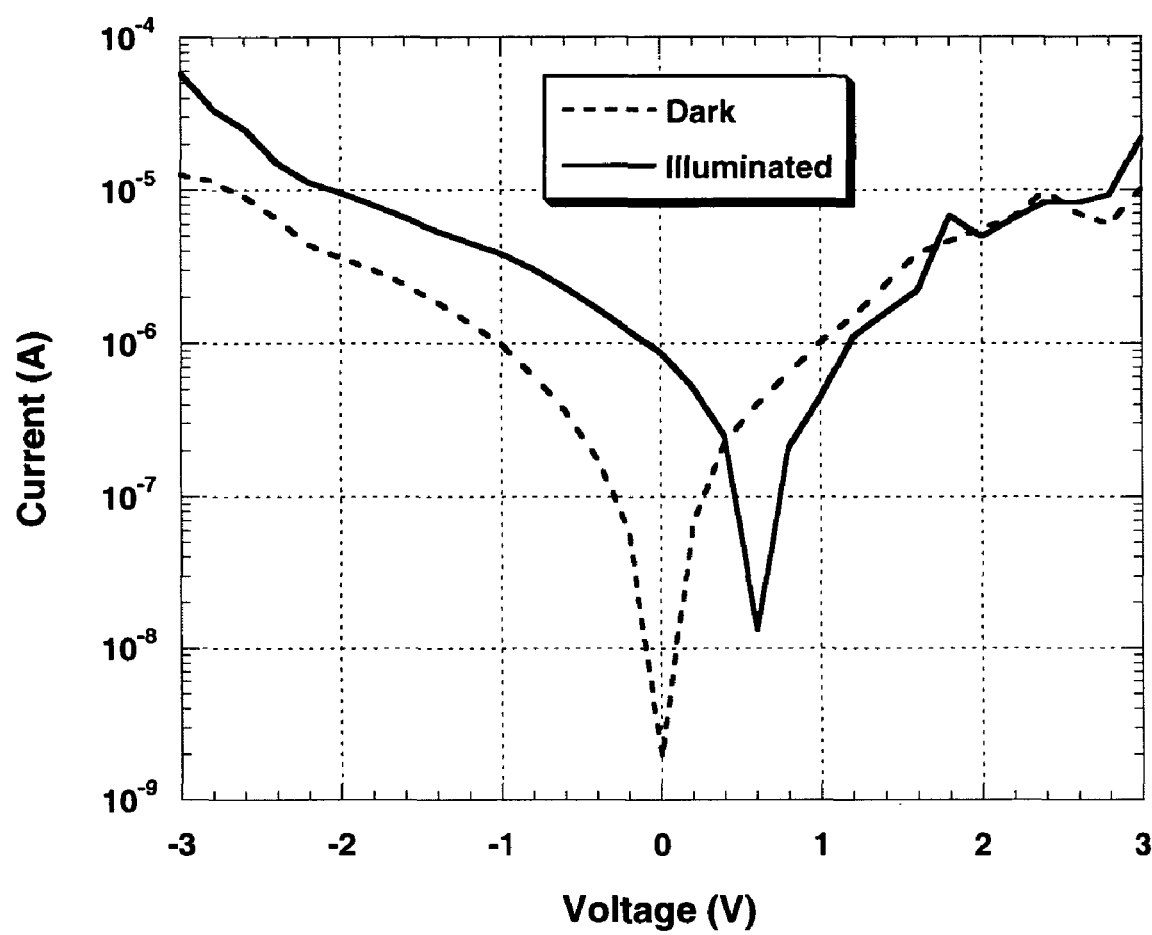
FIG. 1 is a graph of the current-voltage characteristics of Example 2.

It has been found that electroactive materials, such as light harvesting organics, hole transport organics and electron transporting organics, may exhibit properties of photoactive materials useful for photovoltaic devices when combined with a high $T_g$ polymer at a concentration higher than the percolation threshold hole transport organics and electron transporting organics (generally >20 wt %) in a single phase. Although the electroactive materials (e.g., hole transporting and electron transporting materials) may not be photoactive individually, when combined in the photoactive layers as described in this invention, they contribute to the conversion of light energy into electrical energy by facilitating the separation and flow of holes and electrons. Thus, these materials are considered photoactive within the confines of the disclosure herein. The resulting photoactive composition is capable of converting light energy (solar or non-solar) into electrical energy. This is of greatest interest for solar energy but can also be used in photodetection and light detection applications (e.g., sensors).

Photovoltaic devices of the invention have a cathode and an anode and at least one photoactive layer between the anode and the cathode in electrical communication with the anode and the cathode.

The photoactive material of the invention is capable of adsorbing sunlight and conversion of the energy into electrical energy by conversion of incident photons into a charge-separated excited state (bound hole-electron pairs—excitons). Charge separation can then occur with holes extracted at the high work function electrode and electrons extracted at the low work function electrode.

A photoactive layer of the photovoltaic device of the invention comprises a composition comprising a high $T_g$ organic polymer and a photoactive material, wherein the photoactive material is at least one member selected from the group consisting of a hole transporting organic material, an electron transporting organic material, and a light harvesting organic material, wherein the polymer and the photoactive material are in a single phase, and the photoactive material constitutes at least 20% by weight of the composition.

Organic Polymers

The high $T_g$ polymer will have a $T_g$ of at least 125° C., preferably at least 150° C., and most preferably at least 200° C. Thus the expression "high $T_g$ polymer(s)" as used herein means polymers having a glass transition temperature of at least 125° C.

The organic polymer preferably constitutes about 20 to about 80 wt. % of the photoactive layer, and in some of these preferred embodiments, constitutes about 40 to about 60 wt. % of the photoactive layer. Employing a photoactive layer containing less than 20 wt. % photoactive material may not provide a percolation pathway adequate for transport of holes and electrons to the light emitting material. Lower levels of the photoactive material do not allow for sufficient transport to yield desired photovoltaic results.

Suitable organic polymers include but are not limited to polycarbonates, polyarylates, polyimides, poly(amide-imides), poly(aryl ethers) and the like.

Preferably, these polymers are insulating (not conductive or semiconductive) and are amorphous. In certain embodiments of the invention, these polymers are capable of being applied from solvent and are miscible with the photoactive materials of the invention. It has been found that the high $T_g$ is needed in order to prevent migration of the miscible organic species and maintain dimensional stability of the photoactive layer in the photovoltaic device. The high $T_g$ polymer is also needed to prevent the crystallization of the photoactive species incorporated in the photoactive layer(s). Direct exposure to sunlight results in significant temperature rise of the device over the ambient conditions, thus necessitating a high $T_g$ for the photoactive layer(s). The presence of miscible organics decreases the polymer $T_g$. Thus, if lower $T_g$ polymeric materials were employed, the resulting $T_g$ of the active layer could be below the application use temperature. This problem has not been previously recognized in the prior art references discussed above wherein polymers such as poly(vinyl acetate), polystyrene, poly (methyl methacrylate) etc., have been used as polymeric binders for active species, i.e., photoactive materials. In these references as noted previously, the active species are phase separated from the polymer binder and thus lower $T_g$ could be employed. In the present invention, photoactive materials are miscible with the polymer forming a single phase, thus a different case exists and the high $T_g$ is necessary.

For utility in photovoltaic devices, high $T_g$ amorphous organic materials are preferred to prevent migration and assure dimensional stability of the active layer(s). This is particularly important if several layers are employed involving active light harvesting organics, hole transport materials and/or electron transport materials. Interdiffusion of the layers would disrupt the desired p-n like interface (junction) and result in loss of efficiency.

A preferred class of high $T_g$ polymers comprises poly(aryl ether)s such as those described in U.S. Pat. Nos. 5,658,994 and 5,874,516. A particularly preferred polymer from this class of materials is the condensation polymer from the polymerization of 4,4'-dibromobiphenyl with 9,9-bis(4-hydroxyphenyl)fluorene.

In certain of these embodiments, the poly(arylene ether) comprises repeating units of the structure:

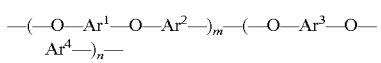

wherein m is 0 to 1, n is 1–m and $Ar^1$, $Ar^2$, $Ar^3$ and $Ar^4$ are independently divalent arylene radicals. In these embodiments, $Ar^1$, $Ar^2$, $Ar^3$ and $Ar^4$ are preferably divalent arylene radicals independently selected from the group consisting of:

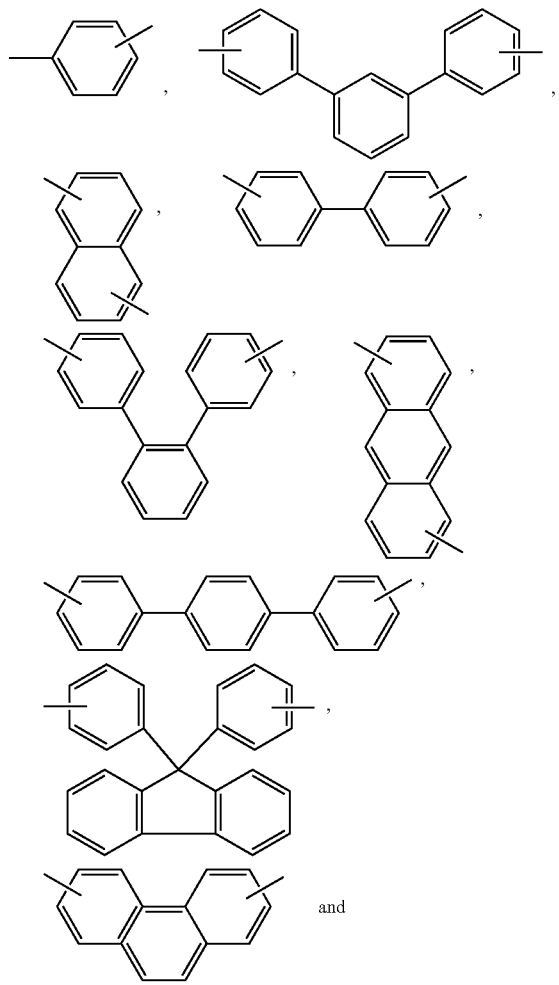

and

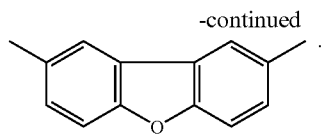

provided that $Ar^1$, $Ar^2$, $Ar^3$ and $Ar^4$ cannot be isomeric equivalents other than diradical 9,9-diphenylfluorene. In certain embodiments, m is 0.5 and n is 0.5. In certain other embodiments, m is 1 and $Ar^1$ is biphenyl radical.

Another poly(aryl ether) of interest is poly(2,6-dimethyl-1,4-phenylene oxide) having $T_g\sim210°$ C. and similar structures with various substitution on the aromatic ring, provided the $T_g$ is equal to or greater than 125° C. Other poly(aryl ether)s discussed in a reference by Robeson et al. (in "Molecular Basis of Transitions and Relaxations", edited by Dale J. Meier, Gordon and Breach Science Publishers, New York, pp.405-425) are suitable for use in the present invention.

Another class of high $T_g$ compounds involves polyarylates such as those derived from bisphenols (such as Bisphenol A) and tere(iso)phthaloyl chlorides and as well as polyestercarbonates comprised of the above units of polyarylates and polycarbonates.

In certain embodiments of the invention, high $T_g$ polymers are aromatic polyimides, poly(amide-imides), amorphous aromatic polyamides, polybenzimidazoles, and polybenzoxazoles.

Poly(aryl ketones) and polysulfones can be employed in applications wherein the UV stability is less critical or a proper UV stabilization can be provided.

In certain embodiments of the invention, the photoactive layer comprises mixtures of the high $T_g$ polymers. Also, when more than one photoactive layer is employed the high $T_g$ polymer of each layer can be the same or different. One of the advantages of having different polymers for different layers is an opportunity to use different solvent combinations during coating so that the layer being coated with another layer is not re-dissolved.

Photoactive Materials

The photoactive layer of the invention comprises a composition of the present invention, which comprises a photoactive material dispersed in the organic polymer matrix. The photoactive materials of the invention are defined as materials that exhibit photoactive properties in photovoltaic applications and include light harvesting organics, hole transport organics and electron transporting organics. The photoactive materials of the invention can be combinations of the photoactive materials.

In the preferred embodiment of the invention, the photoactive material is a combination of hole transport organics and electron transporting organics. Optionally, the photoactive materials of the invention can be combinations of the light harvesting organics, hole transport organics and electron transporting organics. The photoactive materials preferably constitute about 20 to about 80 wt. % of the photoactive layer, and in some of the preferred embodiments, about 40 to about 60 wt. % of the photoactive layer.

Suitable photoactive materials must be miscible with the high $T_g$ polymers of the invention. This will provide increased $T_g$ (of the active species), greatly improved mechanical properties and film integrity, decreased crystallization rates, and the ability to be utilized in spin-on processing, ink-jet printing, and roll-to-roll printing processes.

Suitable photoactive materials include but are not limited to fluorescent compounds such as laser dyes as well as other active organic species, including distyrenyl derivatives such as those described in U.S. Pat. Nos. 5,503,910, 5,121,029, and 6,214,481.

Hole transporting materials of the invention include but are not limited to: 4-(dicyanomethylene)-2-methyl-6-(4-dimethylaminostyryl)-4H-pyran(DCM); tetrathiofulvalene (TTF); oligothiophenes such as α-quaterthiophene and α-hexathiophene and thiophene derivatives; oligophenylenevinylenes; oligofluorenes; phthalocyanines; porphyrins; and aryl amine derivatives such as 4,4',4"-Tris(N-(2-naphthyl)-N-phenyl-amino)-triphenylamine, N,N'-bis(4-methylphenyl)-N,N'-bis(phenyl)-benzidine, and N,N'-di(naphthalene-2-yl)-N,N'-diphenylbenzidine. Structures comprising aromatic tertiary amines, benzidine and pyrazoline derivatives commonly employed in LED applications are also applicable in this invention. Suitable arylamine and benzidine derivatives include, e.g., N,N'-bis(3-methylphenyl)-N,N'-bis(phenyl)-benzidine, 1,3,-5-tris(3-methyldiphenylamino)benzene; 4,4'-Bis(carbazol-9-yl)biphenyl; 4,4',4"-Tris(carbazol-9-yl)-triphenylamine (CAS#139092-78-7); N,N,N',N'-Tetrakis(3-methylphenyl)-benzidine. Suitable pyrazoline derivatives include, e.g., PYR-7 and PYR-9 dislcosed by Takeshi Sano et al., *J. Mater. Chem.*, 2000, 10 (1), 157-161:

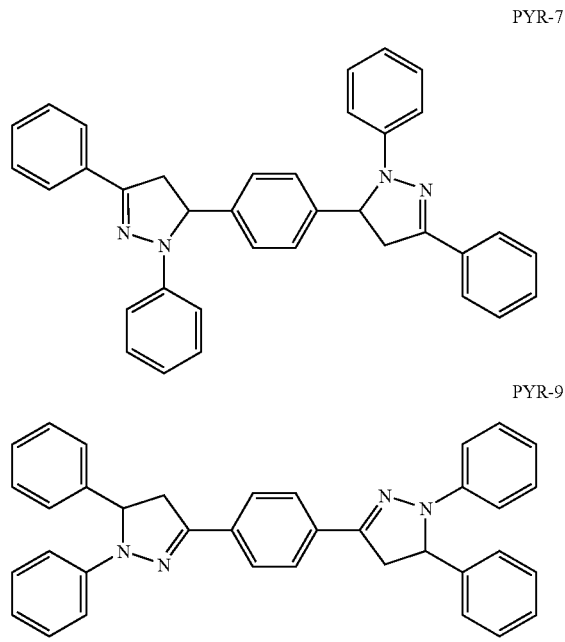

PYR-7

PYR-9

Electron transporting materials of the invention include but are not limited to: 2,4,7-trinitrofluorenone; ortho-benzoquinone; tetracyanoquindomethane (TCNQ); tetracyanoethylene; perylene derivatives such as N,N'-bis(2,5-di-tert-butylphenyl)-3,4,9,10-perylenedicarboximide (CAS#83054-80-2), perylene-3,4,9,10-tetracarboxylicdianhydride (PTCDA), N,N'-bis(1-ethylpropyl)-3,4,9,10-perylene bis(tetracarboxyl diimide) (EP-PTC), and N,N'-ditridecyl-3,4,19,10-perylenetetracarboxylicdiimide (CAS#95689-92-2).

The electron transporting materials commonly employed in LED applications can also be utilized in this invention. These electron transporting materials, include but are not limited to oxadiazole, triazole, phenantroline, quinolinolato and benzoquinolinolato functional organics. Suitable examples of oxadiazole derivatives include, e.g., 2-(4-biphenylyl)-5-(p-tert-butylphenyl)-1,3,4-oxadiazole (PBD); 2,2'-(1,3-phenylene) bis[5-[4-(1,1-dimethylethyl)phenyl]]-1,3,4-oxadiazole (CAS#138372-67-5); and 1,3-Bis(4-(4-diphenylamino)-phenyl-1,3,4-oxidiazol-2-yl)-benzene (CAS#184101-39-1). Suitable examples of triazole derivatives (hole blocker—electron transporter) include, e.g., 3,4,5-triphenyl -1,2,4-triazole; 3,5-bis(4-tert-butyl-phenyl)-4-phenyl-1,2,4-triazole; and 3-(4-biphenylyl)-4-phenyl-5-tert-butylphenyl-1,2,4-triazole. Suitable examples of phenanthroline derivatives include, e.g., 2,9-dimethyl-4,7-diphenyl-1,10-phenanthroline (BCP; CAS#4733-39-5). Suitable examples of quinolinolato and benzoquinolinolato complexes include, e.g., tris(8-hydroxyquinolinolato) aluminum (Alq$_3$); bis(10-hydroxybenzo[h]quinolinolato) beryllium (Bebq$_2$); 2,2',2"-(1,3,5-benzenetriyl)tris-[1-phenyl -1H-benzimidazole] (TPBI); and cyano substituted oligophenylenevinylene derivatives.

Light harvesting organics of the invention include but are not limited to rhodamine dyes such as rhodamine B and rhodamine 6G, pyrromethene dyes, perylenes, and coumarin dyes. 4-(dicyanomethylene)-2-methyl-6-(4-dimethylaminostyryl)-4H-pyran(DCM) can act as both a light harvesting organic and a hole transporting material. A combination of an electron transporting electroactive material and a hole transporting electroactive material can also be considered to be the light harvesting organics. The light harvesting organics for a specific device are chosen based on the absorption spectrum of the charge transporting material (i.e., electron transporting material and hole transporting material) or material combination aiming to cover the wavelength of the solar spectrum that is not covered by the absorption of the charge transporting material(s). The light harvesting material absorbs solar energy and then transfers it to the charge transporting material.

In certain embodiments of the invention, additional materials can be added to photoactive layer(s) of this invention including but not limited to inorganic materials such as TiO$_2$, nanoparticles, conjugated polymers and photoactive/electroactive materials immiscible with the high T$_g$ polymers of this invention. UV stabilizers can also be incorporated in the photoactive layers of the invention.

Photovoltaic Device Structure

Photovoltaic devices of the invention have a cathode and an anode and at least one photoactive layer between the anode and the cathode being in electrical communication with the anode and the cathode.

At least one electrode, anode or cathode, preferably anode must be transparent to incident light. This electrode is comprised of a transparent electrically conducting layer on a transparent insulating or non-conductive substrate. The transparent non-conductive substrate is preferably a glass sheet or a polymer sheet or a film. Examples of polymers used for the transparent non-conductive substrate include but are not limited to poly(methyl methacrylate), polycarbonates, polyarylates, poly(ethylene terephthalate), poly(vinyl fluoride) and the like. The UV stability of the polymeric substrate is important and limits the choice of potential materials.

Non-limiting examples of a conducting layer include indium oxide, indium tin oxide, tin oxide, doped zinc oxide, conducting polymers such as poly(3,4-ethylenedioxythiophene) doped with poly(styrene sulfonic acid) or other appropriate dopants, sulfonated polyaniline derivatives, doped polypyrroles, polymers comprising thienothiophene units with proper dopants and the like.

The other electrode (cathode) can consist of at least one member selected from the group comprising calcium, magnesium, indium, aluminum, silver and the like. Alloys of such members can be utilized as well as layered structures comprised of different metals or alloys. LiF/Al combination can also be utilized as cathode. The cathode in many photovoltaic devices is opaque, however, transparent cathodes can also be used in the invention. The transparent cathode is preferred because the distance the electron needs to travel to the cathode is less due to adsorption closer to the cathode with light passing through the cathode. This is often the case as hole mobility usually is faster than electron mobility. In the case of a transparent cathode, the anode needs to be refractive.

The construction of photovoltaic devices of the invention is not limited to disclosure herein and can be greatly varied. In one preferred embodiment of the present invention, the photovoltaic device of the invention comprises a first photoactive layer having the high $T_g$ polymer mixed with a hole transporting organic, the first photoactive layer being adjacent to the anode and a second photoactive layer having the high $T_g$ polymer mixed with an electron transporting organic, the second photoactive layer being adjacent to the cathode. Light harvesting organics can be included optionally in one or both layers.

In another preferred embodiment of the present invention, the photovoltaic device of the invention further comprises a third photoactive layer containing the high $T_g$ polymer mixed with a light harvesting material and optionally with a hole transporting organic and/or an electron transporting organic. In another preferred embodiment, the third photoactive layer is comprised of a combination of a hole transporting organic and an electron transporting organic. Also, any two of the above three layers can be used for a photovoltaic device. Photoactive layers without high $T_g$ polymers can be included in the photovoltaic device provided that at least one layer comprises a high $T_g$ polymer.

The light harvesting material can be mixed into a polymer matrix and coated on the outer side of the transparent (for example, anode) substrate. The light harvesting material can also be directly mixed into the substrate. In this design, the light harvesting material can absorb UV light (acting like a UV filter) and re-emit the absorbed energy at a longer wavelength where at least one of the materials sandwiched between anode and cathode has absorption. The light harvesting material can also absorb at a wavelength where none of the materials sandwiched between anode and cathode has absorption, and then emit the energy again at a longer wavelength where at least one of the materials sandwiched between the anode and cathode has absorption. Since the light harvesting material is outside of the space between anode and cathode, it will not impart the transport of holes or electrons, but can still contribute to the overall device performance by acting like an antenna.

In the manufacturing of the photovoltaic device, the hole transporting organic containing layer can be applied via spin coating, spray coating, meniscus coating, screen printing, ink jet printing or roll-to-roll processing. Low molecular weight transporting organic materials can be applied using sputtering or evaporative coating techniques. The transporting organic containing layer can be applied by vacuum deposition as well as the other methods noted for the transporting organic containing layer.

The photoactive layer comprising high $T_g$ amorphous polymers with miscible low molecular weight photoactive materials can be applied from an appropriate solvent via spin coating, ink jet printing, screen printing or roll-to-roll printing processes. The electron transport organic containing layer(s) can be applied via vacuum deposition or the methods noted for the photoactive layers.

The anode and cathode can be applied via sputtering or thermal vacuum evaporation/deposition techniques well known in the art as well as screen printing, ink-jet printing or roll-to-roll processing.

For lower cost fabrication, continuous layer application (such as solvent coating, spray coating) is desired as compared to vacuum vapor deposition. In certain embodiments of the present invention, polymers substrates are flexible. Mechanical durability of the light harvesting layer as well as the other layers is preferred.

The invention will be illustrated in more detail with reference to the following Examples, but it should be understood that the present invention is not deemed to be limited thereto.

EXAMPLE 1

A solution was prepared by dissolving 6.1 mg of N,N'-bis (2,5-di-tert-butylphenyl)-3,4,9,10-perylenedicarboximide (BP-PDCBI, CAS#83054-80-2), 6.1 mg of 4-(dicyanomethylene)-2-methyl-6-(4-dimethylaminostyryl)-4H-pyran (DCM, CAS#51325-91-8) and 6.8 mg of PAE-2 in 1.00 g of chlorobenzene and filtering with a 0.2 μm filter. The solution is referred to hereinafter as Solution 1. A polished soda lime float glass (2.5×2.5×0.7 cm) coated on one side with indium tin oxide (sheet resistance about 12 Ω/square) was cleaned by ultrasonication sequentially using detergent, de-ionized water, methanol, isopropanol, and acetone for 5 min each. The ITO coated glass substrate was allowed to dry between different cleaning solvents. After being exposed to UV-ozone for 10 min, the ITO glass substrate was placed on the chuck of a Laurell Model WS-400-N6PP spinner. A water-based dispersion of poly (3,4-ethylenedioxythiophene): polystyrene sulfonic acid (PEDOT) diluted from the original solid contents of about 1.3 wt % of Baytron P from Bayer Corporation to ~0.5 wt % using de-ionized water was applied to it at a spin rate of 1200 rpm. Then, the PEDOT coated sample was placed on a hotplate and annealed at about 100° C. for 15 min. Next, the annealed sample was placed on the chuck of the spinner, and Solution 1 was applied to it at a spin rate of 1200 rpm. Finally, the sample was masked, and Al/Ag layer were sequentially deposited via thermal vacuum evaporation at a pressure of $\sim 5 \times 10^{-6}$ Torr. The device's active area was about 7 mm$^2$. The finished device was connected to a Keithley 2400 SourceMeter (ITO side to the positive electrode and Al/Ag to the negative electrode). The current-voltage curves of the device in the dark and under the illumination of a 150 W Xenon lamp were measured. An open circuit voltage about 0.6-0.8 V was observed.

EXAMPLE 2

A solution was prepared by dissolving 6.6 mg of N,N'-bis (2,5-di-tert-butylphenyl)-3,4,9,10-perylenedicarboximide (BP-PDCBI, CAS#83054-80-2), 6.4 mg of N,N'-bis (3-methylphenyl)-N,N'-diphenylbenzidine (TPD, CAS#65181-78-4) and 5.1 mg of PAE-2 in 1.00 g of chlorobenzene and filtered with a 0.2 μm filter. The solution is referred to hereinafter as Solution 2. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. After being exposed to UV-ozone for 10 min, the ITO glass substrate was placed on the chuck of a Laurell Model WS-400-N6PP spinner, and a water based dispersion of poly (3,4-ethylenedioxythiophene): polystyrene sulfonic acid (PEDOT) diluted from the original solid contents of about 1.3 wt % of Baytron P from Bayer Corporation to ~0.5 wt % using de-ionized water was applied to it at a spin rate of 1200 rpm. Then the PEDOT coated sample was placed on a hotplate and annealed at about 100° C. for 15 min. After that, the annealed sample was placed on the chuck of the spinner, and Solution 2 was applied to it at a spin rate of 1200 rpm. Finally the sample was masked and Al/Ag layer were sequentially deposited via thermal vacuum evaporation at a pressure of ~$5 \times 10^{-6}$ Torr. The device active area was about 7 mm$^2$. The finished device was connected to a Keithley 2400 SourceMeter (ITO side to the positive electrode and Al/Ag to the negative electrode). The current-voltage (IV) curves of the device in the dark and under the illumination of a 150 W Xenon lamp were measured. An open circuit voltage of 0.6 V and a short circuit current of 0.87 μA were observed. The IV curves are shown in FIG. 1.

EXAMPLE 3

Figure 2:
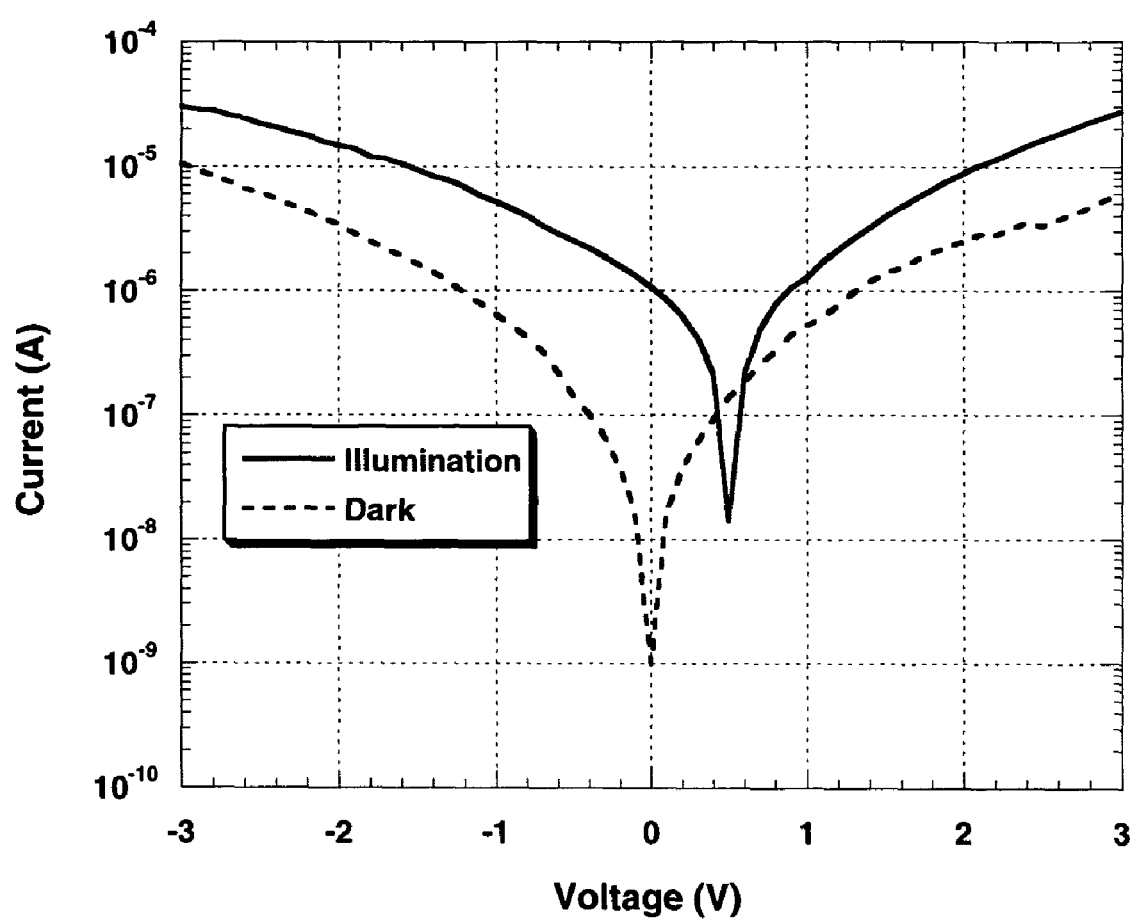
FIG. 2 is a graph of the current-voltage characteristics of Example 3.

A solution was prepared by dissolving 3.2 mg of N,N'-bis (2,5-di-tert-butylphenyl)-3,4,9,10-perylenedicarboximide (BP-PDCBI, CAS#83054-80-2), 3.0 mg 2,3,7,8,12,13,17,18-Octaethyl-21H,23H-porphine zinc(II) (ZnOEP, CAS#17632-18-7) and 10.4 mg of Ardel D100 polyarylate (PAL) in 1.24 g of chlorobenzene and filtered with a 0.2 μm filter. The solution is referred to hereinafter as Solution 3. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. The ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to it at a spin rate of 2000 rpm. Then, the PEDOT coated sample was annealed at about 160° C. for 30 min under nitrogen protection. Next, the annealed sample was placed on the chuck of the spinner, and Solution 3 was applied to it at a spin rate of 1200 rpm. Finally, the sample was masked, and a layer of 120-nm-thick Al was deposited via thermal vacuum evaporation at a pressure of $1.9 \times 10^{-7}$ Torr. The device's active area was about 7 mm$^2$. The finished device was connected to a Keithley 2400 SourceMeter (ITO side to the positive electrode and Al to the negative electrode). The current-voltage (IV) curves of the device in the dark and under the illumination of a 150 W Xenon lamp were measured. An open circuit voltage of 0.6 V and a short circuit current of 1.04 μA were observed. The IV curves are shown in FIG. 2.

EXAMPLE 4

Figure 3:
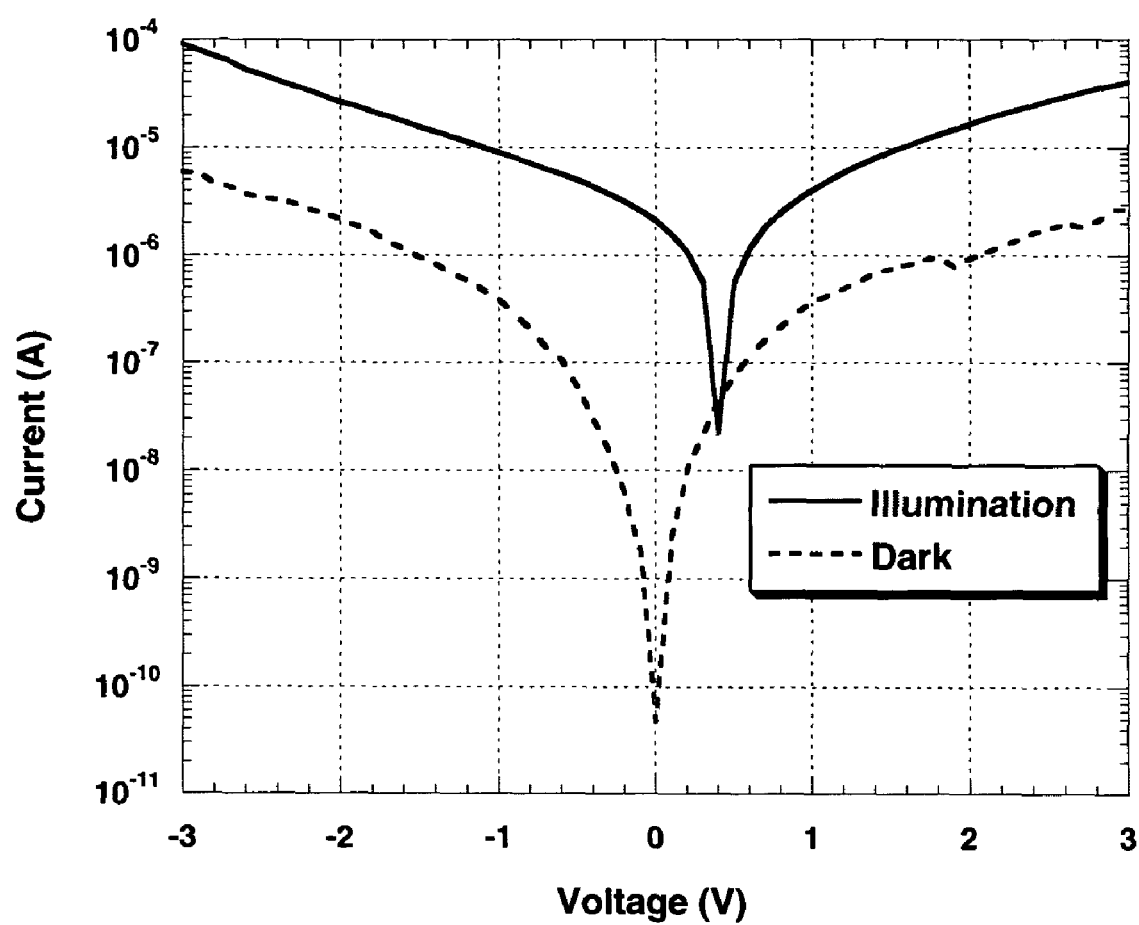
FIG. 3 is a graph of the current-voltage characteristics of Example 4.

A solution, referred to hereinafter as Solution 4, was prepared by dissolving 5.6 mg of N,N'-bis (2,5-di-tert-butylphenyl)-3,4,9,10-perylenedicarboximide (BP-PDCBI, CAS #83054-80-2), 4.5 mg of 2,3,7,8,12,13,17,18-Octaethyl-21H,23H-porphine magnesium(II) (MgOEP, CAS#20910-35-4) and 10.1 mg of Ardel D100 polyarylate in 1.00 g of chlorobenzene and filtered with a 0.2 μm filter. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. The ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to it at a spin rate of 2000 rpm. Then, the PEDOT coated sample was annealed at about 160° C. for 30 min under nitrogen protection. The annealed sample was then placed on the chuck of the spinner, and Solution 4 was applied to it at a spin rate of 1200 rpm. Finally, the sample was masked and a layer of 120-nm-thick Al was deposited via thermal vacuum evaporation at a pressure of $1.9 \times 10^{-7}$ Torr. The device's active area was about 7 mm$^2$. The finished device was connected to a Keithley 2400 SourceMeter (ITO side to the positive electrode and Al to the negative electrode). The current-voltage (IV) curves of the device in the dark and under the illumination of a 150 W Xenon lamp were measured. An open circuit voltage of 0.4 V and a short circuit current of 2.26 μA were observed. The IV curves are shown in FIG. 3.

EXAMPLE 5

Figure 4:
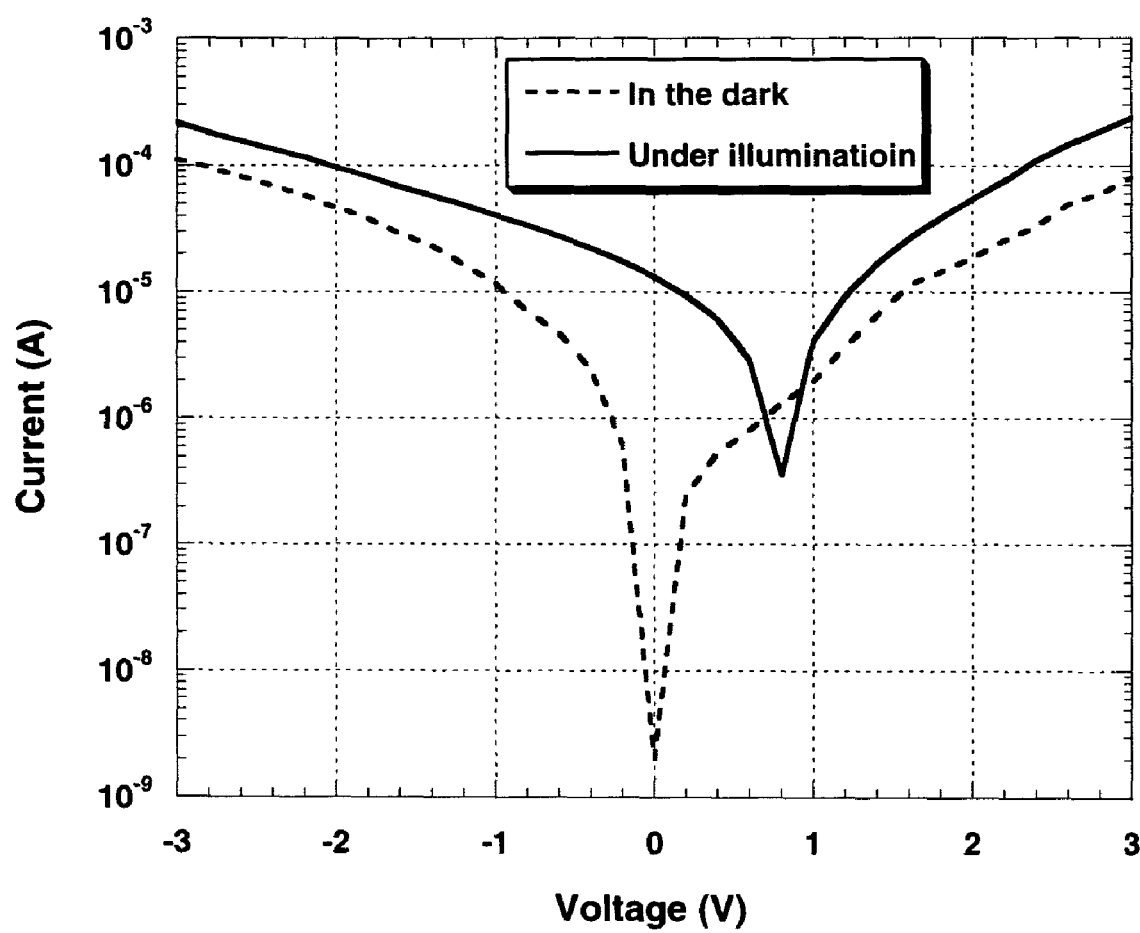
FIG. 4 is a graph of the current-voltage characteristics of Example 5.

A solution was prepared by dissolving 5.2 mg of N,N'-bis (2,5-di-tert-butylphenyl)-3,4,9,10-perylenedicarboximide (BP-PDCBI, CAS#83054-80-2), 6.9 mg of N,N'-bis (3-methylphenyl)-N,N'-diphenylbenzidine (TPD, CAS#65181-78-4) and 5.2 mg of PAE-2 in 1.00 g of chlorobenzene and filtered with a 0.2 μm filter. The solution is referred to hereinafter as Solution 5. A polished soda lime float glass (2.5×2.5×0.7 cm) coated on one side with indium tin oxide (surface resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. After being treated with $O_2$ plasma for 5 min, the ITO glass substrate was placed on the chuck of a Laurell Model WS-400-N6PP spinner and a water based dispersion of poly (3,4-ethylenedioxythiophene): polystyrene sulfonic acid (PEDOT, Baytron P from Bayer Corp.) was applied to it at a spin rate of 1500 rpm. Then the PEDOT coated sample was annealed at about 160° C. for 15 min under nitrogen protection. After that, the annealed sample was placed on the chuck of the spinner and Solution 5 was applied to it at a spin rate of 1200 rpm. Finally, the sample was masked, a layer of 25-nm-thick Ca was deposited via thermal vacuum evaporation at a pressure of $2.2 \times 10^{-7}$ Torr, and a layer of 100-nm-thick Ag was further deposited as a protective layer. The device's active area was about 7 mm$^2$. The finished device was connected to a Keithley 2400 SourceMeter (ITO side to the positive electrode and Ca/Ag to the negative electrode). The current-voltage (IV) curves of the device in the dark and under the illumination of a 150 W Xenon lamp were measured. An open circuit voltage of 0.7 V and a short circuit current of 13.1 μA were observed. The IV curves are shown in FIG. 4.

EXAMPLE 6

A solution was prepared by dissolving 9.2 mg of N,N'-bis (3-methylphenyl)-N,N'-diphenylbenzidine (TPD, CAS#65181-78-4), 6.6 mg of N,N'-bis (2,5-di-tert-butylphenyl)-3,4,9,10-perylenedicarboximide (BP-PDCBI, CAS#83054-80-2), and 7.2 mg of PAE-2 in 1.31 g of chlorobenzene and filtered with a 0.2 μm filter. The solution is referred to hereinafter as Solution 6. Four polished soda lime float glass substrates (2.5×2.5×0.7 cm) coated on one side with indium tin oxide (sheet resistance ~12 Ω/square) were cleaned by ultrasonication sequentially using detergent, de-ionized water, methanol, isopropanol, and acetone for 5 min each. The ITO coated glass substrates were allowed to dry between different cleaning solvents. After being treated with $O_2$ plasma for 5 min, the ITO glass substrates were placed, one at a time, on the chuck of a Laurell Model WS-400-N6PP spinner and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then, the PEDOT coated samples were annealed at about 160° C. for 30 min under nitrogen protection. After that, the annealed samples were placed on the chuck of the spinner, one at a time, and Solution 6 was applied onto the PEDOT layer at a spin rate of 1200 rpm. The four samples were then annealed at 70° C. for 30 min, 100° C. for 30 min, 130° C. for 20 min, and 160° C. for 10 min, respectively. Finally, the samples were masked, a layer of 25-nm-thick Ca was deposited via thermal vacuum evaporation at a pressure of $2.0\times10^{-7}$ Torr, and a layer of 130-nm-thick Ag was further deposited as a protective layer. The active area of the devices was about 7 $mm^2$. The finished devices were connected to a Keithley 2400 SourceMeter (ITO side to the positive electrode and Ca/Ag to the negative electrode), one at a time, and the current-voltage (IV) curves of the devices in the dark and under the illumination of a 150 W Xenon lamp were measured. Table 1 summarizes the device performances. It can be seen from the table that annealing improves the device performance.

TABLE 1

Performances of ITO/PEDOT/PAE-2:TPD:BP-PDCBI (31:40:29)/Ca/Ag PV devices.

| Annealing protocol | Open circuit voltage (V) | Short circuit current (μA) |
| --- | --- | --- |
| 70° C. for 30 min under $N_2$ | 0.40 | 23.3 |
| 100° C. for 30 min under $N_2$ | 0.30 | 37.8 |
| 130° C. for 20 min under $N_2$ | 0.40 | 48.2 |
| 160° C. for 10 min under $N_2$ | 0.60 | 83.0 |

EXAMPLE 7

Figure 5:
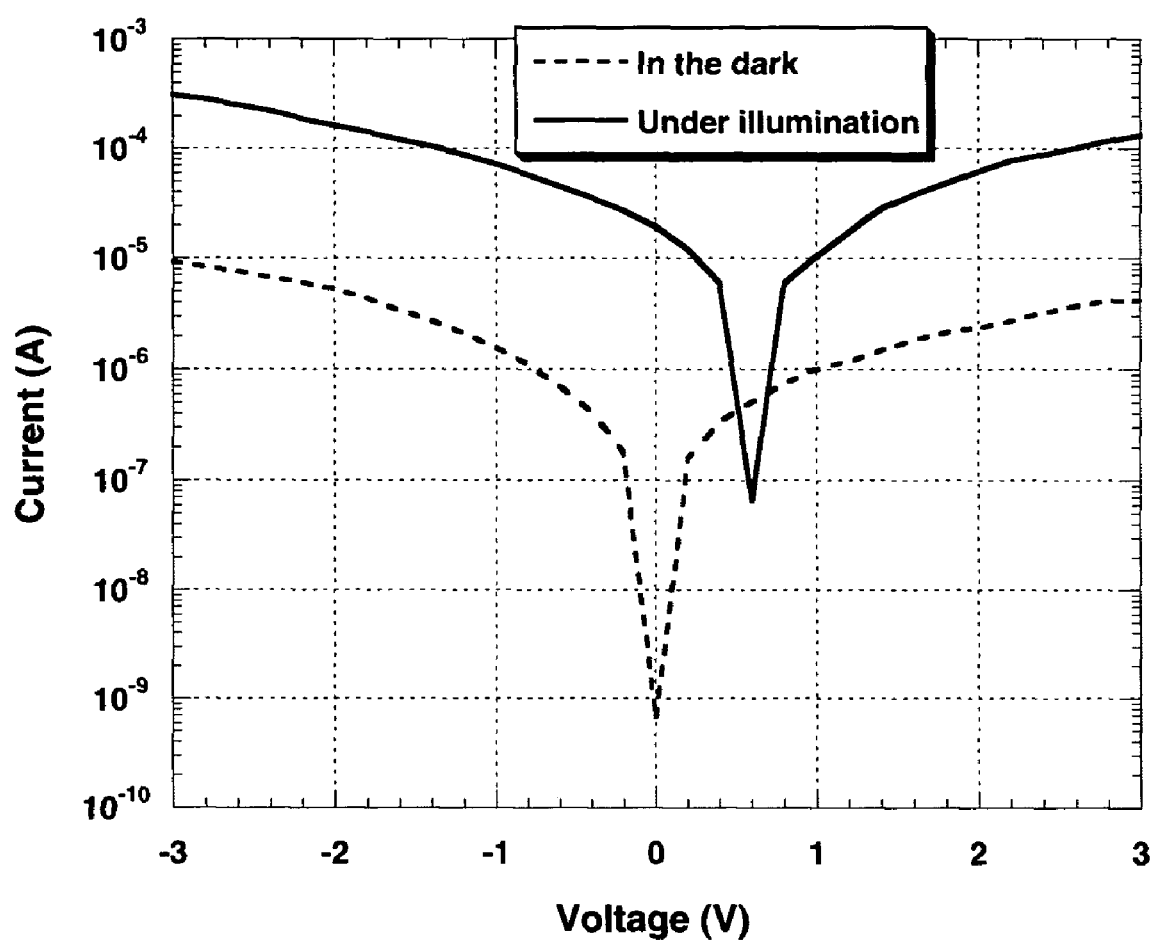
FIG. 5 is a graph of the current-voltage characteristics of Example 7.

A polished soda lime float glass (2.5×2.5×0.7 cm) coated on one side with indium tin oxide (surface resistance ~12 Ω/square) was cleaned by ultrasonication sequentially in detergent, de-ionized water, methanol, isopropanol, and acetone; each for 5 min. The ITO coated glass substrate was allowed to dry between different cleaning solvents. After being treated with $O_2$ plasma for 5 min, the ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to the ITO substrates at a spin rate of 3000 rpm. The PEDOT coated sample was annealed at about 160° C. for 20 min under nitrogen protection. The annealed sample was then placed on the chuck of the spinner, and Solution 6 was applied onto the PEDOT layer at a spin rate of 1200 rpm. Finally, the sample was masked, and a layer of 150-nm-thick Ag was deposited via thermal vacuum evaporation at a pressure of $1.2\times10^{-7}$ Torr. The active area of the device was about 7 $mm^2$. The finished device was connected to a Keithley 2400 SourceMeter (ITO side to the positive electrode and Ag to the negative electrode). The current-voltage (IV) curves of the device in the dark and under the illumination of a 150 W Xenon lamp were measured. An open circuit voltage of 0.6 V and a short circuit current of 22.8 μA were achieved. The IV characteristics are shown in FIG. 5.

EXAMPLE 8

Figure 6:
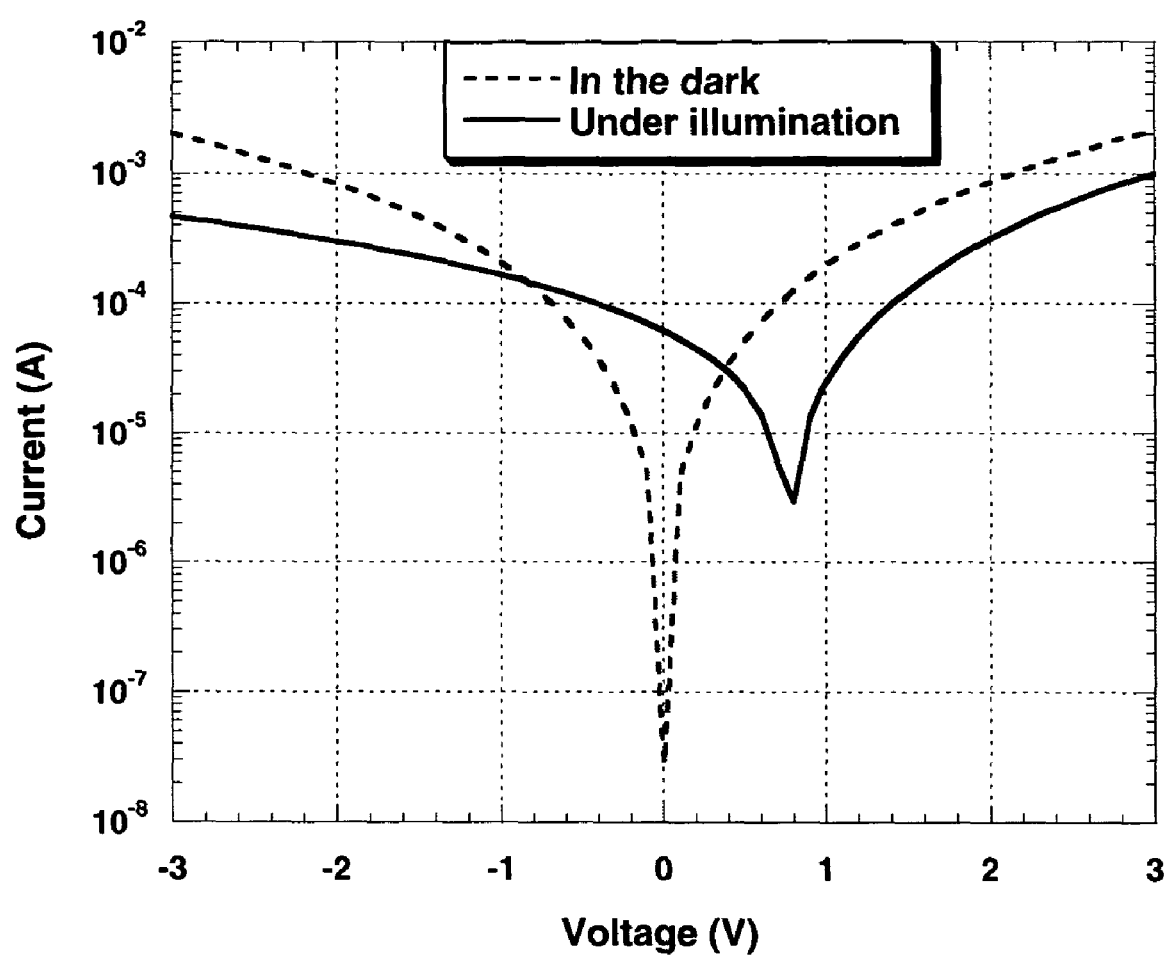
FIG. 6 is a graph of the current-voltage characteristics of Example 8.
Figure 7:
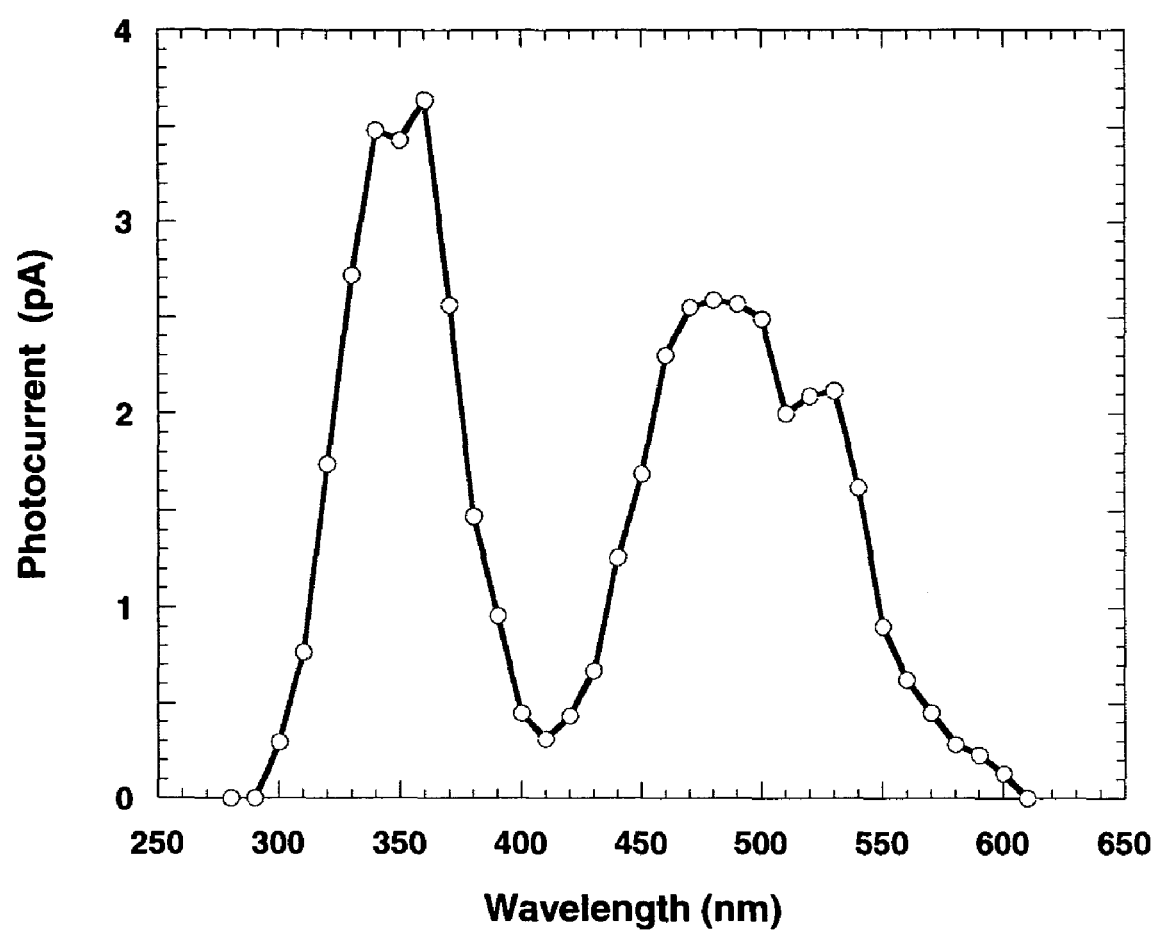
FIG. 7 is a graph of the wavelength-photocurrent characteristic action spectrum of Example 8.

A solution was prepared by dissolving 11.0 mg of N,N'-bis (3-methylphenyl)-N,N'-diphenylbenzidine (TPD, CAS#65181-78-4), 12.4 mg of N,N'-bis (2,5-di-tert-butylphenyl)-3,4,9,10-perylenedicarboximide (BP-PDCBI, CAS#83054-80-2), and 13.6 mg of Ardel D100 polyarylate (PAL) in 2.00 g of chlorobenzene and filtered with a 0.2 μm filter. The solution is referred to as Solution 8. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. After being treated with $O_2$ plasma for 5 min, the ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then, the PEDOT coated sample was annealed at about 160° C. for 20 min under nitrogen protection. The sample was then placed on the chuck of the spinner, and Solution 8 was applied onto the PEDOT layer at a spin rate of 1200 rpm. Finally, the sample was masked, and a layer of 150-nm-thick Al was deposited via thermal vacuum evaporation at a pressure of $1.0\times10^{-7}$ Torr. The active area of the device was about 7 $mm^2$. The finished device was connected to a Keithley 2400 SourceMeter (ITO side to the positive electrode and Al to the negative electrode). The current-voltage (IV) curves of the device in the dark and under the illumination of a 150 W Xenon lamp were measured. An open circuit voltage of 0.8 V and a short circuit current of 61.8 μA was achieved. The IV characteristics are shown in FIG. 6. The action spectrum of the device was also measured using a Jobin Yvon H10 compact monochromator to separate monochromatic light from the Xenon lamp. The measured action spectrum is shown in FIG. 7. Two peaks corresponding well to the absorption of TPD and BP-PDCBI, respectively, can be clearly seen in the action spectrum, which indicates that absorption in both TPD and BP-PDCBI can contribute to photocurrent generation. This is ideal for photovoltaic device applications.

EXAMPLE 9

A solution was prepared by dissolving 19.7 mg of N,N'-bis (3-methylphenyl)-N,N'-diphenylbenzidine (TPD, CAS#65181-78-4), 14.8 mg of N,N'-bis (2,5-di-tert-butylphenyl)-3,4,9,10-perylenedicarboximide (BP-PDCBI, CAS#83054-80-2), and 18.7 mg of PAE-2 in 2.64 g of chlorobenzene. The solution is referred to as Solution 9A.

Figure 8:
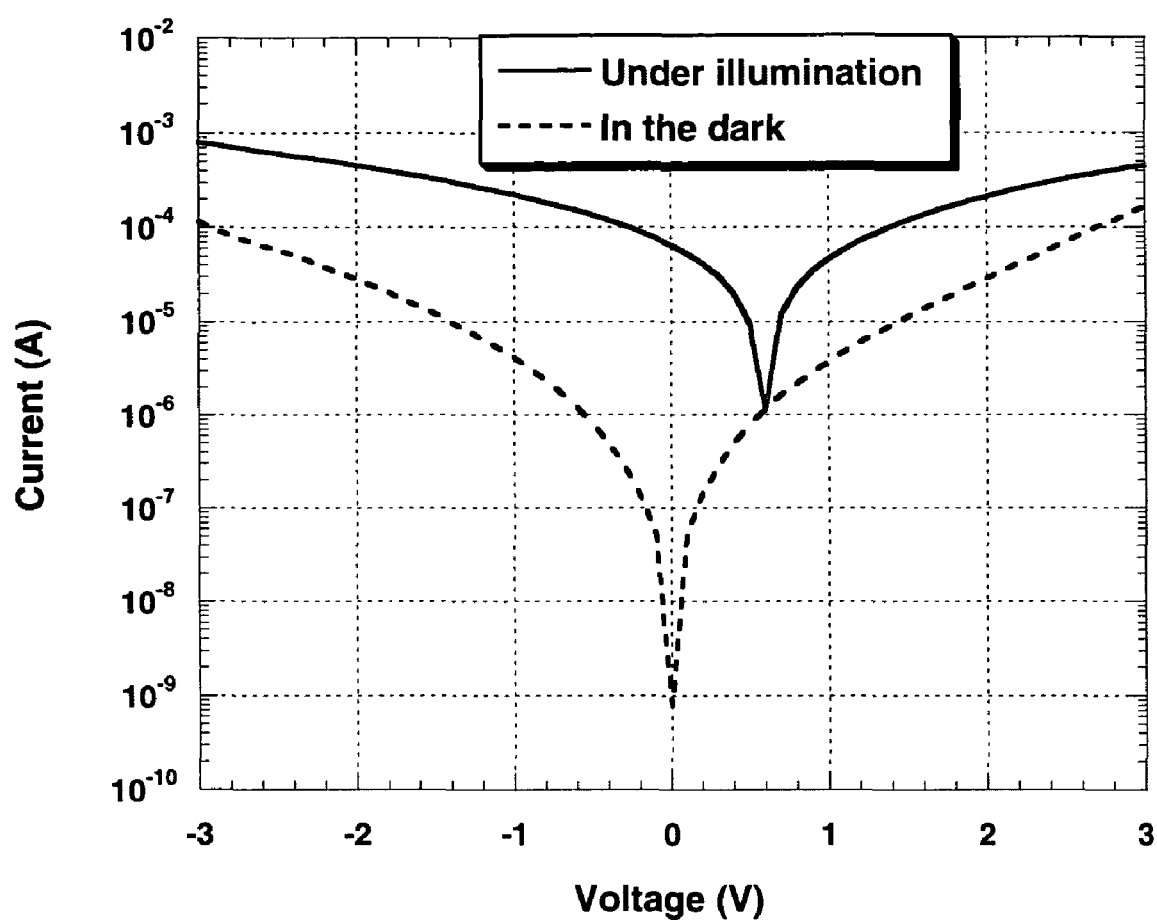
FIG. 8 is a graph of the current-voltage characteristics of Example 9.
Figure 9:
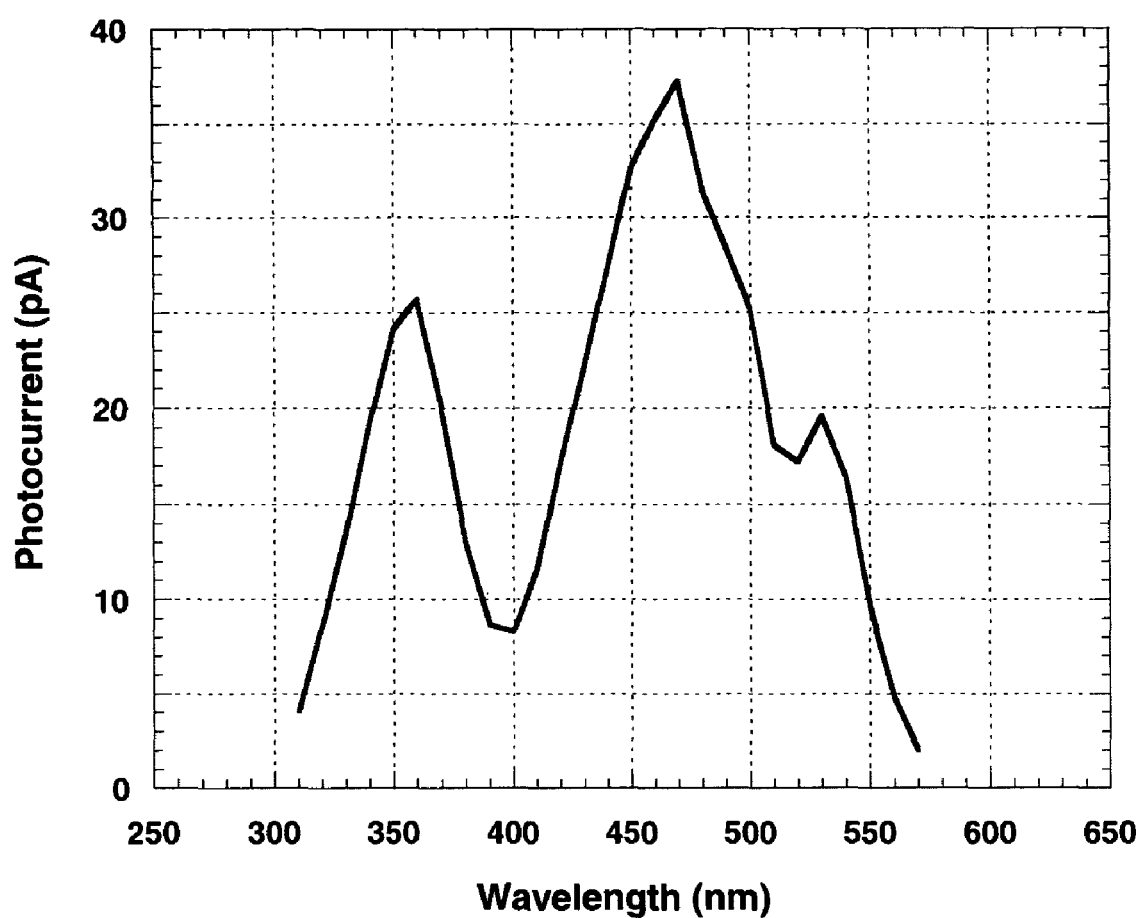
FIG. 9 is a graph of the wavelength-photocurrent characteristic action spectrum of Example 9.

Another solution, referred to as Solution 9B, was prepared by dissolving 2.5 mg Coumarin 6 in 1.00 g of Solution 9A, and filtered with a 0.2 μm filter. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. After being treated with $O_2$ plasma for 5 min, the ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then, the PEDOT coated samples were annealed at about 160° C. for 30 min under nitrogen protection. After that, the sample was placed on the chuck of the spinner, and Solution 9B was applied onto the PEDOT layer at a spin rate of 1200 rpm. Finally, the sample was masked and a layer of 100-nm-thick Al was deposited via thermal vacuum evaporation at a pressure of $1.2 \times 10^{-7}$ Torr. The active area of the device was about 7 $mm^2$. The finished device was connected to a Keithley 2400 SourceMeter (ITO side to the positive electrode and Al to the negative electrode), and the current-voltage (IV) curves of the device in the dark and under the illumination of a 150 W Xenon lamp were measurement. An open circuit voltage of 0.6V and a short circuit current of 65.0 μA was achieved. The IV characteristics are shown in FIG. 8. The action spectrum of the device was also measured using a Jobin Yvon H10 compact monochromator to separate the monochromatic light from the Xenon lamp. The measured action spectrum is shown in FIG. 9. Compared with the action spectrum of the device without Coumarin 6 (see FIG. 7), the response between 380 and 480 nm in FIG. 9, which corresponds to the absorption of Coumarin 6, is stronger. Coumarin 6 can absorb light between 380 and 480 nm, and then transfer the absorbed energy to BP-PDCBI through Förster energy transfer mechanism. As a result, the response of the device between 380 to 480 nm is enhanced. This demonstrates that a light harvesting dye can be incorporated in the device with hole and electron transporting materials to improve the device performance.

EXAMPLE 10

Figure 10:
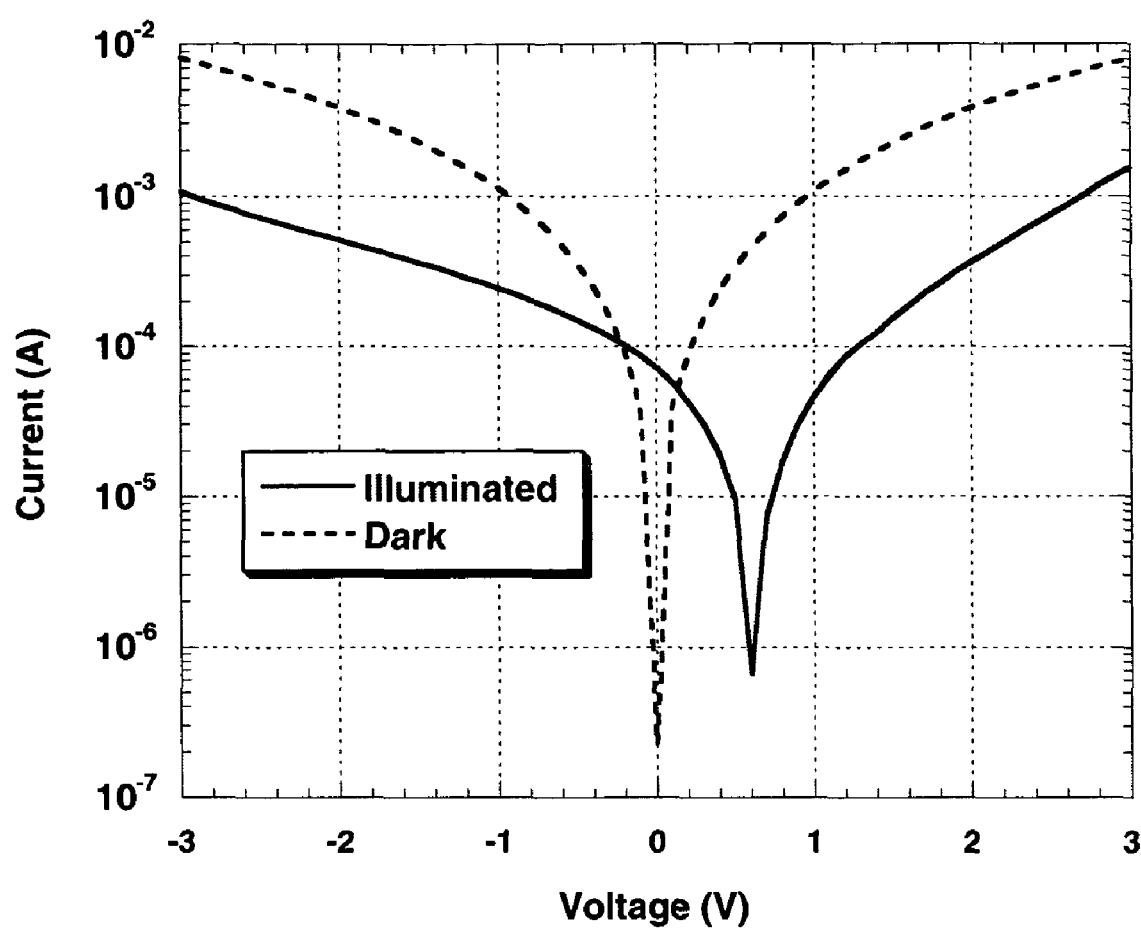
FIG. 10 is a graph of the current-voltage characteristics of Example 10.

A solution, referred to hereinafter as Solution 10, was prepared by dissolving 10.0 mg of Coumarin 6 and 9.0 mg PAE-2 in 0.80 g chlorobenzene. A polished soda lime float glass (2.5×2.5×0.7 cm) coated on one side with indium tin oxide (sheet resistance ~12 Ω/square) was cleaned by ultrasonication sequentially in detergent, de-ionized water, methanol, isopropanol, and acetone; each for 5 min. The ITO coated glass substrate was allowed to dry between different cleaning solvents. After being treated with $O_2$ plasma for 5 min, the ITO glass substrate was placed on the chuck of a Laurell Model WS-400-N6PP spinner and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then the PEDOT coated samples were annealed at about 160° C. for 30 min under nitrogen protection. After that, the sample was placed on the chuck of the spinner, and Solution 8 was applied onto the PEDOT layer at a spin rate of 1200 rpm. The sample was then masked and a layer of 100-nm-thick Al was deposited via thermal vacuum evaporation at a pressure of $1.2 \times 10^{-7}$ Torr. The active area of the device was about 7 $mm^2$. Finally, a layer of light harvesting Coumarin 6 in PAE-2 was spin coated onto the glass side of the device at a spin rate of 1200 rpm from Solution 10. The finished device was connected to a Keithley 2400 SourceMeter (ITO side to the positive electrode and Al to the negative electrode), and the current-voltage (IV) curves of the device in the dark and under the illumination through the ITO side of a 150 W Xenon lamp were measured. An open circuit voltage of 0.6V and a short circuit current of 86.2 μA was achieved. The IV characteristics are shown in FIG. 10.

EXAMPLE 11

Figure 11:
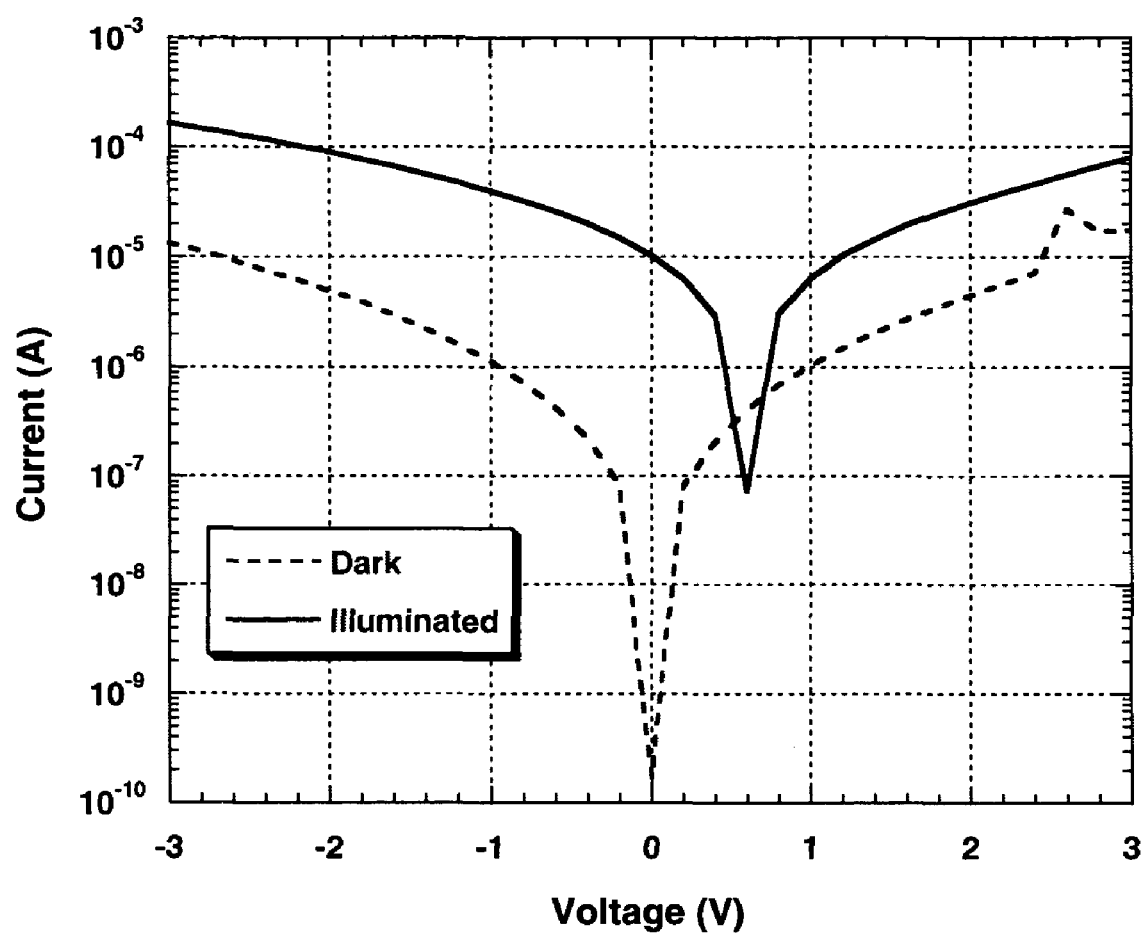
FIG. 11 is a graph of the current-voltage characteristics of Example 11.

A solution, referred to hereinafter as Solution 11, was prepared by dissolving 8.2 mg of N,N'-bis (3-methylphenyl)-N,N'-diphenylbenzidine (TPD, CAS#65181-78-4), 7.6 mg of N,N'-bis (2,5-di-tert-butylphenyl)-3,4,9,10-perylenedicarboximide (BP-PDCBI, CAS #83054-80-2), 7.2 mg PAE-2 and 7.2 mg of Ardel D100 polyarylate (PAL) in 1.53 g of cyclopentanone and filtered with a 0.2 μm filter. A polished soda lime float glass (2.5×2.5×0.7 cm) coated on one side with indium tin oxide (sheet resistance ~12 Ω/square) was cleaned by ultrasonication sequentially using detergent, de-ionized water, methanol, isopropanol, and acetone for 5 min each. The ITO coated glass substrate was allowed to dry between different cleaning solvents. After being treated with $O_2$ plasma for 5 min, the ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then, the PEDOT coated sample was annealed at about 100° C. for 30 min under nitrogen protection. The sample was then placed on the chuck of the spinner, and Solution 11 was applied onto the PEDOT layer at a spin rate of 1000 rpm. Finally, the sample was masked, and a layer of 100-nm-thick Al was deposited via thermal vacuum evaporation at a pressure of $1.4 \times 10^{-7}$ Torr. The active area of the device was about 7 $mm^2$. The finished device was connected to a Keithley 2400 SourceMeter (ITO side to the positive electrode and Al to the negative electrode), and the current-voltage (IV) curves of the device in the dark and under the illumination of a 150 W Xenon lamp were measured. An open circuit voltage of 0.6 V and a short circuit current of 12.7 μA was achieved. The IV characteristics are shown in FIG. 11.

EXAMPLE 12

Figure 12:
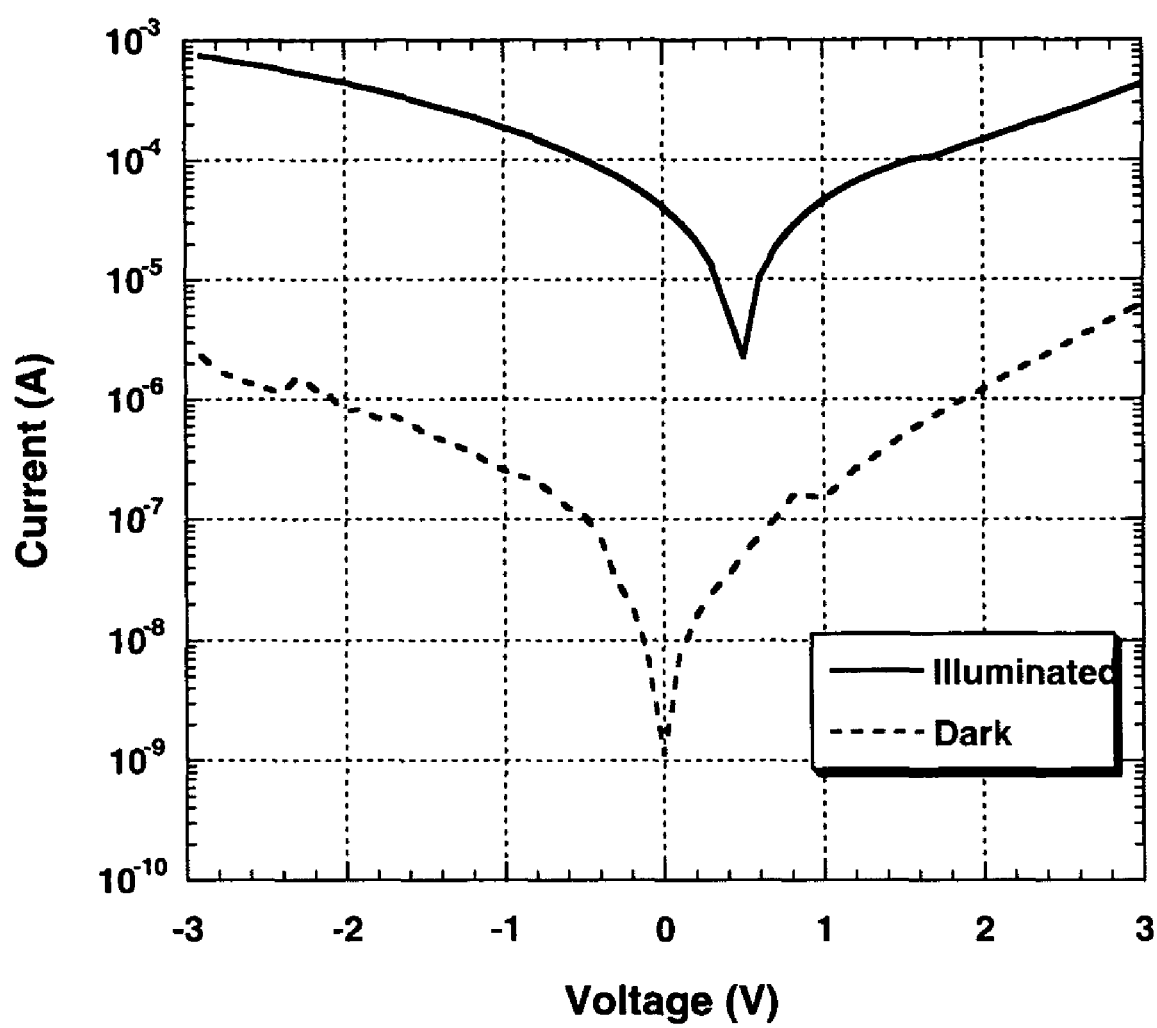
FIG. 12 is a graph of the current-voltage characteristics of Example 12.

A solution was prepared by dissolving 6.4 mg of N,N'-bis (3-methylphenyl)-N,N'-diphenylbenzidine (TPD, CAS#65181-78-4), 6.9 mg of N,N'-bis (2,5-di-tert-butylphenyl)-3,4,9,10-perylenedicarboximide (BP-PDCBI, CAS#83054-80-2), 3.8 mg poly[2-methoxy, 5-(2'-ethylhexyloxy)-p-phenylene-vinylene] (MEH-PPV) and 3.2 mg of Ardel D100 polyarylate (PAL) in 1.56 g of cyclopentanone and filtered with a 0.2 μm filter. The solution is referred to as Solution 12 hereinafter. A polished soda lime float glass (2.5×2.5×0.7 cm) coated on one side with indium tin oxide (sheet resistance ~12 Ω/square) were cleaned by ultrasonication sequentially using detergent, de-ionized water, methanol, isopropanol, and acetone for 5 min each. The ITO coated glass substrate was allowed to dry between different cleaning solvents. After being treated with $O_2$ plasma for 5 min, the ITO glass substrate was placed on the chuck of a Laurell Model WS-400-N6PP spinner, and a water based dispersion of poly (3,4-ethylenedioxythiophene): polystyrene sulfonic acid (PEDOT, Baytron P from Bayer Corp.) was applied to the ITO substrates at a spin rate of 3000 rpm. Then, the PEDOT coated sample was annealed at about 100° C. for 30 min under nitrogen protection. The sample was then placed on the chuck of the spinner, and Solution 12 was applied onto the PEDOT layer at a spin rate of 1000 rpm. Finally, the sample was masked, and a layer of 100-nm-thick Al was deposited via thermal vacuum evaporation at a pressure of $1.4 \times 10^{-7}$ Torr. The active area of the device was about 7 mm². The finished device was connected to a Keithley 2400 SourceMeter (ITO side to the positive electrode and Al to the negative electrode), and the current-voltage (IV) curves of the device in the dark and under the illumination of a 150 W Xenon lamp were measured. An open circuit voltage of 0.5 V and a short circuit current of 40.1 μA was achieved. The IV characteristics are shown in FIG. 12.

While the invention has been described in detail and with reference to specific examples thereof, it will be apparent to one skilled in the art that various changes and modifications can be made therein without departing from the spirit and scope thereof.

The invention claimed is:

1. A photovoltaic device comprising:
an anode;
a cathode; and
at least one photoactive layer wherein the at least one photoactive layer comprises a composition comprising at least one polymer having a glass transition temperature of at least 125° C. and at least one photoactive material, wherein: (a) the photoactive material comprises a light harvesting organic material, (b) the polymer and the photoactive material are in a single phase, (c) the photoactive material comprises at least 20% by weight of the composition, (d) the at least one photoactive layer is in electrical communication with the anode and the cathode, (e) the anode and the cathode are configured to conduct an electric charge from the at least one photoactive layer that is produced by the at least one photoactive layer absorbing light, (f) the anode is transparent and the photovoltaic device further comprises a transparent substrate on a side of the anode facing away from the at least one photoactive layer, and (g) the polymer comprises poly(arylene ether) comprising repeating units of a structure:

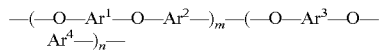

wherein m is 0 to 1, n is 1–m and Ar¹, Ar², Ar³ and Ar⁴ are independently divalent arylene radicals.

2. The photovoltaic device of claim 1, wherein the polymer of the composition is amorphous and not conductive.

3. The photovoltaic device of claim 1, wherein the glass transition temperature of the polymer of the composition is at least 150° C.

4. The photovoltaic device of claim 1, wherein Ar¹, Ar², Ar³ and Ar⁴ are divalent arylene radicals independently selected from the group consisting of:

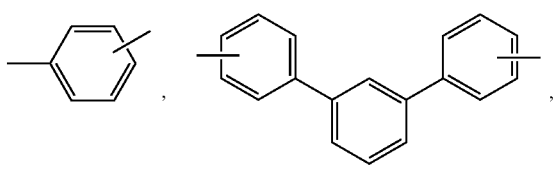

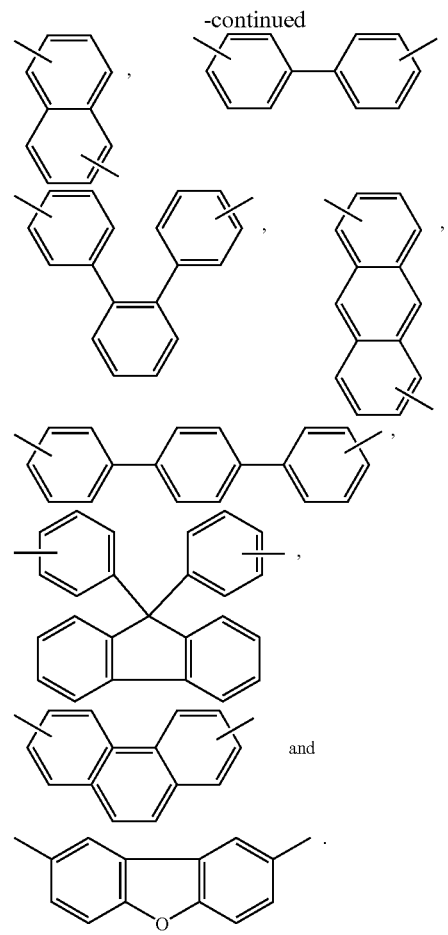

provided that Ar¹, Ar², Ar³ and Ar⁴ cannot be isomeric equivalents other than diradical 9,9-diphenylfluorene.

5. The photovoltaic device of claim 1, wherein m is 0.5 and n is 0.5.

6. The photovoltaic device of claim 1, wherein the photoactive material comprises at least 50 percent by weight of the composition of the photoactive layer.

7. The photovoltaic device of claim 1, wherein the light harvesting organic material comprises at least one member selected from the group consisting of Rhodamine dyes, pyrromethene dyes, perylenes, Coumarin dyes, and 4-(dicyanomethylene)-2-methyl-6-(4-dimethylaminostyryl)-4H-pyran (DCM).

8. The photovoltaic device of claim 7 wherein the light harvesting organic material comprises 4-(dicyanomethylene)-2-methyl-6-(4-(dimethylaminostyryl)-4H-pyran (DCM).

9. The photovoltaic device of claim 7 wherein the light harvesting organic material comprises Courmarin dyes.

10. The photovoltaic device of claim 1, wherein the photoactive layer comprises two layers.

11. The photovoltaic device of claim 10, wherein the first photoactive layer is in contact with the cathode and the second photoactive layer is in contact with the anode.

12. The photovoltaic device of claim 10, wherein the at least one photoactive layer further comprises a third photoactive layer in communication with at least one of the first photoactive layer and the second photoactive layer, the third photoactive layer containing the light harvesting material.

13. The photovoltaic device of claim 12, wherein the third photoactive layer is placed between the first photoactive layer and the second photoactive layer.

14. The photovoltaic device of claim 12, wherein the first photoactive layer is in contact with the cathode and the second photoactive layer is in contact with the anode.

15. The photovoltaic device of claim 1 wherein the light harvesting organic material is coated on an outer side of the transparent substrate and/or mixed with the transparent substrate.

16. A method for manufacturing the photovoltaic device of claim 1, said method comprising:
   providing an anode;
   providing a cathode; and
   providing at least one photoactive layer between the anode and the cathode, wherein the at least one photoactive layer is in electrical communication with the anode and the cathode and wherein the anode and the cathode are configured to conduct an electric charge from the at least one photoactive layer produced by the at least one photoactive layer absorbing light.

17. The method of claim 16, wherein the at least one photoactive layer is manufactured by a fabrication technique selected from the group consisting of spin coating, screen printing, ink jet printing and roll-to-roll printing.

18. The method of claim 16, wherein the anode is provided on a first side of the at least one photoactive layer, the cathode is provided on a second side of the at least one photoactive layer, and a transparent substrate is provided on a side of the anode facing away from the at least one photoactive layer.

19. The photovoltaic device of claim 1 wherein the polymer is miscible with the photo active material and increases the glass transition temperature of the photo active material.

20. A photovoltaic device comprising:
   an anode;
   a cathode; and
   at least one photoactive layer, wherein the at least one photoactive layer comprises a composition comprising at least one amorphous polymer having a glass transition temperature of at least 200° C. and at least one photoactive material, wherein: (a) the photoactive material comprises a light harvesting organic material, (b) the polymer and the photoactive material are miscible and form a single phase, (c) the amount of photoactive material is sufficient to decrease the glass transition temperature of the polymer, (d) the amount of polymer is sufficient to reduce crystallization of the photoactive material and increase the dimensional stability of the photoactive layer, (e) the at least one photoactive layer is in electrical communication with the anode and the cathode, and (f) the polymer comprises poly(arylene ether) comprising repeating units of a structure:

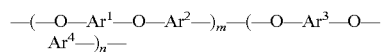

wherein m is 0 to 1, n is 1−m and $Ar^1$, $Ar^2$, $Ar^3$ and $Ar^4$ are independently divalent arylene radicals.

21. The photovoltaic device of claim 20, wherein the photoactive material of the composition further comprises at least one hole transporting organic material selected from the group consisting of 4-(dicyanomethylene)-2-methyl-6-dimethylaminostyryl)-4H-pyran (DCM), tetrathiofulvalene (TTF), α-quaterthiophene, α-hexathiophene, thiophene derivatives, oligophenylenevinylenes, oligofluorenes, phthalocyanines, porphyrins, aryl amine derivative, 4,4',4"-Tris(N-(2-naphthyl)-N-phenyl-amino)-triphenylamine, N,N'-bis(4-methylphenyl)-N,N'-(phenyl)-benzidine, and N,N'-di(naphthalene-2-yl)-N,N'-diphenylbenzidine.

22. The photovoltaic device of claim 20, wherein the photoactive material of the composition further comprises at least one electron transporting organic material selected from the group consisting of 2,4,7-trinitrofluorenone, ortho-benzoquinine, tetracyanoquindomethane (TCNQ), tetracyanoethylene, perylene derivatives, N,N'-bis(2,5-di-tert-butylphenyl)-3,4,9,10-perylenedicarboximide, perylene-3,4,9,10-tetracarboxylicdianhydride (PTCDA), N,N'-bis(1-ethylpropyl)-3,4,9,10-perylene bis(tetracarboxyl diimide) (EP-PTC), and N,N'-ditridecyl-3,4,19,10-perylenetetracarboxylicdiimide.

* * * * *

UNITED STATES PATENT AND TRADEMARK OFFICE
CERTIFICATE OF CORRECTION

PATENT NO. : 7,309,833 B2
APPLICATION NO. : 10/630279
DATED : December 18, 2007
INVENTOR(S) : Lloyd M. Robeson, Xuezhong Jiang and William F. Burgoyne, Jr.

It is certified that error appears in the above-identified patent and that said Letters Patent is hereby corrected as shown below:

Column 18, Line 57

In claim 9 delete the word "Courmarin" and insert the word -- Coumarin --

Column 20, Line 23

In claim 21 delete the word "dimethylaminostyryl)-4H-pyran" and insert the word -- (4-dimethylaminostyryl)-4H-pyran --

Column 20, Line 28

In claim 21 insert the word -- bis -- before (phenyl)

Column 20, Line 34

In claim 22 delete the word "benzoquinine" and insert the word -- benzoquinone --

Signed and Sealed this

Fifteenth Day of April, 2008

JON W. DUDAS
*Director of the United States Patent and Trademark Office*